(12) United States Patent
Kishimoto et al.

(10) Patent No.: US 10,937,985 B2
(45) Date of Patent: Mar. 2, 2021

(54) ORGANIC EL LIGHT-EMITTING ELEMENT AND MANUFACTURING METHOD THEREOF

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/616,469

(22) PCT Filed: Nov. 28, 2017

(86) PCT No.: PCT/JP2017/042623
§ 371 (c)(1),
(2) Date: Apr. 9, 2020

(87) PCT Pub. No.: WO2019/106718
PCT Pub. Date: Jun. 6, 2019

(65) Prior Publication Data
US 2020/0280014 A1    Sep. 3, 2020

(51) Int. Cl.
*H01L 51/52*    (2006.01)
*H01L 27/32*    (2006.01)
*H01L 51/00*    (2006.01)

(52) U.S. Cl.
CPC ...... *H01L 51/5203* (2013.01); *H01L 27/3246* (2013.01); *H01L 51/0034* (2013.01); *H01L 51/5237* (2013.01)

(58) Field of Classification Search
CPC combination set(s) only.
See application file for complete search history.

(56) References Cited

U.S. PATENT DOCUMENTS

| | | | |
|---|---|---|---|
| 2004/0263443 A1* | 12/2004 | Shirasaki | G09G 3/325 345/76 |
| 2005/0057151 A1 | 3/2005 | Kuwabara | |
| 2006/0125363 A1 | 6/2006 | Tahira et al. | |
| 2008/0038488 A1 | 2/2008 | Yamamoto | |
| 2008/0220289 A1 | 9/2008 | Shioya et al. | |
| 2008/0233429 A1 | 9/2008 | Oguma et al. | |
| 2011/0275818 A1 | 11/2011 | Yersin et al. | |

(Continued)

FOREIGN PATENT DOCUMENTS

| | | | |
|---|---|---|---|
| JP | 2004-127933 A | 4/2004 | |
| JP | 2006-324021 A | 11/2006 | |

(Continued)

OTHER PUBLICATIONS

International Search Report of PCT/JP2017/042623.

*Primary Examiner* — Nduka E Ojeh
(74) *Attorney, Agent, or Firm* — ScienBiziP, P.C.

(57) ABSTRACT

An organic EL light-emitting element is provided in which, by means of an organic material that is oligomeric, an organic layer coated film 25 is formed in a high-definition pixel pattern in a 100-2500 $\mu m^2$ area; a manufacturing method of said organic EL light-emitting element is also provided. The coated film 25 is formed by dropwise injection of a liquid composition containing an organic material oligomer in openings of insulation banks that are formed at a height of 0.5-1 $\mu m$.

6 Claims, 2 Drawing Sheets

(56) References Cited

U.S. PATENT DOCUMENTS

| | | |
|---|---|---|
| 2012/0025192 A1 | 2/2012 | Shimizu et al. |
| 2013/0017752 A1* | 1/2013 | Kajitani .............. H01L 27/3246 445/58 |
| 2013/0119413 A1 | 5/2013 | Harada et al. |
| 2014/0139102 A1* | 5/2014 | Jeon ...................... H01L 27/326 313/504 |
| 2015/0270485 A1 | 9/2015 | Watanabe |
| 2016/0024322 A1* | 1/2016 | Jain .................... H01L 51/0007 438/46 |
| 2020/0220081 A1* | 7/2020 | Kishimoto .......... H01L 51/0035 |
| 2020/0312929 A1* | 10/2020 | Kishimoto ............. H05B 33/10 |

FOREIGN PATENT DOCUMENTS

| | | |
|---|---|---|
| JP | 2006-324171 A | 11/2006 |
| JP | 2008-218952 A | 9/2008 |
| JP | 2009-267393 A | 11/2009 |
| JP | 2011-223015 A | 11/2011 |
| JP | 2012-059553 A | 3/2012 |
| JP | 2012-506627 A | 3/2012 |
| JP | 2012-104430 A | 5/2012 |
| JP | 2013-089401 A | 5/2013 |
| JP | 2015-185640 A | 10/2015 |
| JP | 2016-001581 A | 1/2016 |
| WO | 2004/030417 A1 | 4/2004 |
| WO | 2005/123856 A1 | 12/2005 |
| WO | 2010/092931 A1 | 8/2010 |
| WO | 2012/017487 A1 | 2/2012 |

\* cited by examiner

ORGANIC EL LIGHT-EMITTING ELEMENT AND MANUFACTURING METHOD THEREOF

TECHNICAL FIELD

The present disclosure relates to an organic EL light-emitting element (organic electroluminescent light-emitting element) and a method of manufacturing the same.

BACKGROUND ART

An organic EL light-emitting element is formed such that a thin layer of organic material containing an organic light-emitting substance is sandwiched between an anode and a cathode. This organic thin layer is formed by a vapor-deposition method or a coating method. In a method of manufacturing of a vapor-deposition type organic thin layer, a supporting substrate (a substrate to be vapor-deposited) and a deposition mask are arranged overlapped, an organic material is vapor-deposited in vacuum through an opening of the deposition mask, and a thin layer is formed on the supporting substrate. In general, low molecular weight compounds are used as an organic material for a vapor-deposition type organic material. On the other hand, in a method of manufacturing of a coated-type organic EL light-emitting element, a thin layer is formed on a supporting substrate using a solution for, for example, a printing process such as a screen printing, an ink-jet process. An organic EL light-emitting element which is produced by a coating process can be produced at a lower manufacturing cost compared to an organic EL light-emitting element which is produced by a vapor-deposition process since, for example, it does not require an expensive vapor mask or equipment for high vacuum process, and an efficiency in use of an organic material in a coating process is higher than a vapor-deposition process. However, it is difficult to produce a good quality thin layer using a coating process since low molecular weight compounds tend to be easily crystallized. Therefore, polymer compounds having a high amorphous property have been used as an organic material in the coating process. For example, Patent Document 1 describes a polymer compound containing a specific repeating unit as an organic material for a coated-type organic EL light-emitting element, which can be used as a light-emitting material or charge transport material. A polymer compound used in a coating process usually contains at least a number of several tens or more of such repeating units.

PRIOR ART DOCUMENT

Patent Document

Patent Document 1: JP 2011-223015 A

SUMMARY OF THE INVENTION

Problems to be Solved by the Invention

As mentioned above, a polymer compound is used for an organic material for a coated-type organic EL light-emitting element. However, in the conventional coated-type organic EL light-emitting element, it is difficult to coat an organic material in a minute dot pattern since a size of a droplet of the organic material is hardly reduced even using an ink-jet method. An attempt has been made to have a coating solution within a pixel by devising an insulation bank arrangement when the display apparatus is large-sized and the pattern formation has large area, for example, a size of each pixel for the display apparatus is a long-side length of 210 μm or more and a short-side length of 70 μm or more. However, an area for each pixel of the display apparatus becomes very small with the reduced weight, size, and thickness and the high definition of the recent electronic apparatus such as a portable device, making unable to separately coat on each pixel even using an ink-jet method, since the droplet spreads across more than one pixels. Also, the purification of polymer compounds is difficult, and it is hard to obtain highly purified polymer compounds. Therefore, when the polymer compounds are used for an organic EL light-emitting element, a luminescent color purity, a light emission efficiency, a brightness and so on might be reduced. Further, if the molecular weight of the polymer compound becomes too high, forming a homogeneous layer may become difficult due to a gelation of polymer compounds.

Further, it has been generally known that the light emission efficiency of the low molecule weight compounds is greater than that of the polymer compounds, the life of the low molecule compounds is longer than that of the polymer compounds, variations in color realized with the low molecule weight compounds is greater than that realized with the polymer compounds, and the performance in blue light emission of the low molecule weight compounds is especially superior compared to that of the polymer compounds. However, a coating solution containing a low molecule weight compound has a high fluidity, thereby the coating solution spreads right after being ejected from a discharge nozzle of the ink-jet apparatus, making it difficult to form a liquid drop of good quality, and, since the low molecule weight compounds tend to be easily crystallized as described above, a layer of a low molecule material is formed in such a way that the material is inhomogeneously distributed, and thus it is difficult to use low molecule weight compounds for a conventional method of manufacturing a coated-type organic EL light-emitting element.

As described above, when the polymer compounds are used for an organic material, it is difficult to prepare a small liquid drop. Therefore, when a pixel size becomes small, a problem arises that a separate coating with high definition on an electrode of the small pixel is unable to be carried out even using an ink-jet method. Further, the difficulty has been enhanced in selectively coating a small-sized desired area with the organic material, due to a droplet diameter of a liquid drop to be ejected, while a technique for manufacturing an organic layer with a smaller size and a higher definition for, for example, a display apparatus for a smartphone is demanded. The inventors have discovered that the reason that a size of the droplet of a coating solution cannot be reduced attributes a molecular weight of an organic material, and found that the molecular weight of an organic material should be 5000 or less, preferably 3000 or less, and the organic material should be an oligomer of the organic material.

The present invention has been made in view of such circumstances as mentioned above, and an object of the present invention is to provide an organic EL light-emitting element having an organic layer with a small size and a high definition pattern by a separate coating of even a small area, such as an area with a size of 10 μm square or 20 μm square, with a coating solution, using an inexpensive printing method for the organic layer formation, and a manufacturing method thereof.

Means to Solve the Problem

An organic EL light-emitting element according to the first embodiment of the present application comprises a substrate, a first electrode provided on a surface of the substrate, an insulation bank formed to surround at least part of the first electrode, an organic layer formed on the first electrode surrounded by the insulation bank, and a second electrode formed on the organic layer, wherein the insulation bank has a forward tapered shape, an area of the first electrode surrounded by the insulation bank is 100 µm² or more and 2500 µm² or less, and the organic layer is a coated-type organic layer comprising an oligomer of an organic material.

A method of manufacturing an organic EL light-emitting element according to the second embodiment of the present application comprises forming a first electrode on a surface of a substrate, forming an insulation bank to surround at least part of the first electrode, forming a coated-type organic layer on an area of the first electrode surrounded by the insulation bank, and forming a second electrode on the organic layer, wherein the insulation bank is formed so that the area of the first electrode surrounded by the insulation bank is 100 µm² or more and 2500 µm² or less and so as to have a height of 0.5 µm or more and 1 µm or less from a surface of the first electrode, and a step for forming the organic layer is conducted by applying a droplet of a liquid composition comprising an oligomer of an organic material using an ink-jet process.

Effect of the Invention

According to the first embodiment of the present application, an organic EL light-emitting element is formed with a coated-type organic layer containing an oligomer of an organic material, thereby a coated-type organic EL light-emitting element is provided in which each pixel of a display apparatus can be constituted by a separate coating of even a very small light-emitting area with a size of, for example, 100 µm² or more and 2500 µm² or less. As a result, a high definition display apparatus can be obtained even for a small apparatus such as a smartphone, even using a coated-type organic EL light-emitting element. Further, according to the second embodiment of the present application, by using a coating solution containing an oligomer of an organic material, an organic EL light-emitting element in which a coated-type organic layer is formed in a high definition pattern can be provided via an ink-jet process without forming an insulation bank being high. As a result, a small, high-definition organic EL light-emitting element can be obtained at a low cost and a small, high-definition display apparatus can be manufactured inexpensively.

EMBODIMENT FOR CARRYING OUT THE INVENTION

The invention will be further described below. The embodiments described below are intended only to provide an example of the disclosure and the invention is not limited to certain embodiments described below.

Figure 1A:
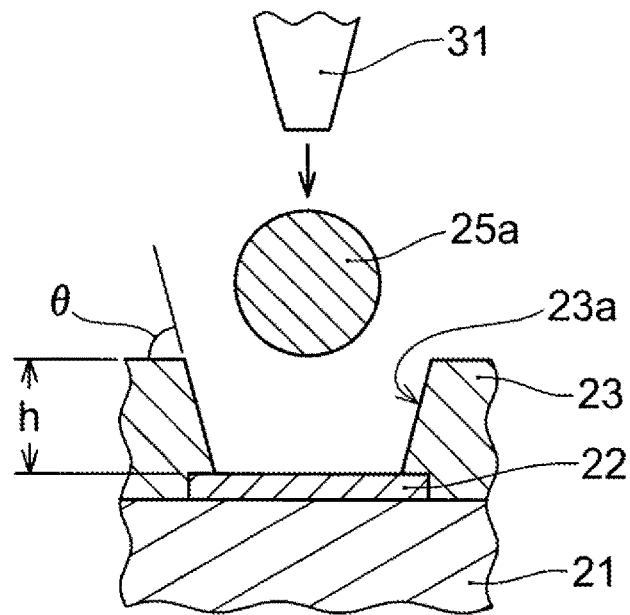
FIG. 1A shows a coating process in a method of manufacturing an organic EL light-emitting element according to one embodiment of the present application.
Figure 1B:
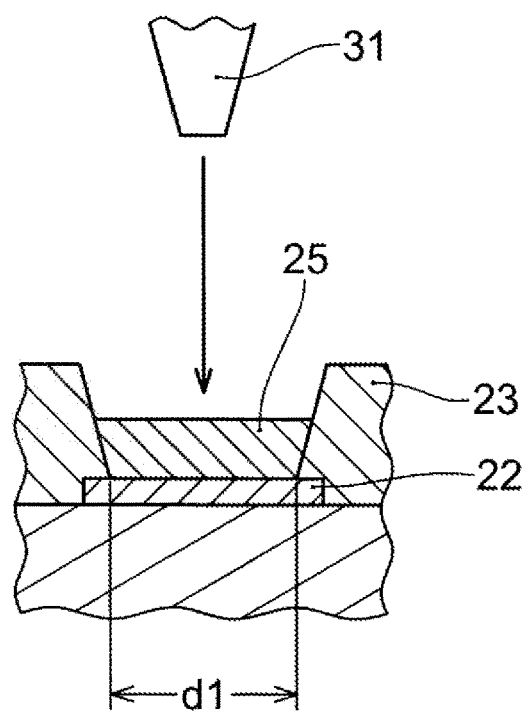
FIG. 1B shows a state in which a coated layer containing an oligomer of an organic material is formed on an electrode during a manufacturing process.
Figure 1C:
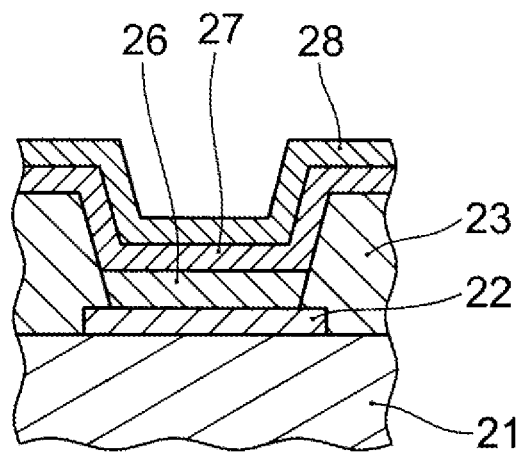
FIG. 1C shows a cross-sectional view of an organic EL light-emitting element according to one embodiment of the present application.

As illustrated in FIG. 1C, which shows a schematic cross-sectional view of an organic EL light-emitting element, an organic EL light-emitting element according to the presently illustrated embodiment comprises a substrate 21, a first electrode 22 (an anode, for example) provided on a surface of the substrate 21, an insulation bank 23 formed to surround at least part of the first electrode 22, an organic layer 26 formed on the first electrode 22 surrounded by the insulation bank 23, a second electrode 27 formed on the organic layer 26, and a barrier layer 28 formed on the second electrode 27. An area of the first electrode surrounded by the insulation bank is 100 µm² or more and 2500 µm² or less, and the organic layer 26 is formed by a coated-type organic layer containing an oligomer of an organic material.

The term "coated-type organic layer" is used herein to refer to the organic layer prepared by drying a coated layer formed by coating process, for example, a coated layer of an organic material formed using a dispenser and a coated layer formed by a printing process such as a screen printing or an ejection of organic material drops by ink-jet process. When a shape of a sidewall of the insulation bank 23, which forms an opening, is formed such that a spacing between sidewalls of the insulation bank 23 in a vertical cross sectional view is increased from a surface of the first electrode 22 toward a top surface of the insulation bank 23, the shape of the insulation bank 23 is referred to herein as "forward tapered shape".

As described above, the conventional, coated-type organic EL light-emitting element has a problem in that the element cannot be formed in a small-sized light-emitting area. When coating an organic material on an area of the electrode, which will constitute each pixel, by, for example, ink-jet process for manufacturing a display apparatus, it is necessary to adjust a physical property of a coating solution ejected from a nozzle of ink-jet apparatus and optimize a ejecting speed of a liquid drop of a coating solution when ejected and a printing condition of an ink-jet apparatus, however, the inventors have found out that among those a size of a liquid drop of a coating solution when being ejected is an important factor to determine a possible size of an area to which an organic layer is provided, and that it is very important to adjust a size of a liquid drop to a desirable size at a pattern forming using an ink-jet process. For example, in order to coat an area to be coated with a high definition pattern by ejecting a coating solution containing an organic material from a nozzle of the ink-jet apparatus, it is necessary to reduce a droplet diameter of a liquid drop to be ejected from a nozzle of the ink-jet apparatus according to the size of a small area to be coated. However, with a conventional coating solution, a volume of a liquid drop when a coating solution of an organic material being ejected using an ink-jet process is about 5 pL to 30 pL in average, and it is impossible to reduce the volume of a coating to solution per one drop to 1 pL or less. A lower limit of a volume of a liquid drop of a coating solution of more than 1 pL is excess for a size of a pixel area on the electrode to which an organic layer will be provided when intending to provide a pixel with a resolution around 500 ppi or a higher pixel density for a display apparatus with a size of the smartphone.

However, as a result of further extensive studies of inventors, the inventors found out that a size of a liquid drop is largely affected by a molecular weight of an organic material. The inventors ascertain that the reason why small droplets cannot be formed is attributed to a fact that a solute (an organic material) in the conventional coating solution is a polymer compound having a high degree of polymerization and a large molecular weight of 10000 or more. It is considered that a size of a liquid drop is affected by a concentration of an organic material in a coating solution (a solubility of an organic material in a solvent) or a viscosity of a coating solution, however, the inventors conducted a test under the condition in which a concentration is as high as possible, yet a dropping of the solution is enable to be conducted.

As a result, the inventors found out that when a molecular weight is 300 or more and 5000 or less, preferably about 3000 or less, more preferably 500 or more and 1000 or less, a liquid droplet volume per one drop can be set to about 0.05 pL to about 1 pL. The inventors conducted various studies with different polymerization methods and tested various compounds with a smaller molecular weight, i.e. a smaller degree of polymerization, and, as a result, the inventors found out that a liquid drop with the above-mentioned size can be obtained by using an organic material having a certain polymerization degree, which can form an oligomer (generally around or less than an icosamer), preferably an dimer to decamer. As a result, a separate coating of a small area, such as an above-described area with a size of 10 μm square or 20 μm square, with a coating solution, was able to be precisely conducted.

As described above, for the conventional, coated-type organic EL light-emitting element, a size of a light-emitting area of the organic EL light-emitting element cannot be reduced to 70 μm×70 μm or less. This means that when a length of one side of a light-emitting area is 70 μm or less, a liquid drop will overflow from the area. Therefore, a pixel size corresponding to a 20-inch QHD display, which is, a size of 70 μm×210 μm, is a limit size of the area that can be formed in the conventional, coated-type organic EL light-emitting element. Even with this size of light-emitting area, various improvements to an insulation bank were needed, as described above. The exemplary organic EL light-emitting element according to the present application will be described in the followings by referring to FIGS. 1A to 1C, in which an insulation bank 23 is formed in a periphery of a first electrode 22, and an organic layer 26 is coated on the first electrode 22 in an opening 23a surrounded by the insulation bank 23. This organic layer 26 forming area constitutes a light-emitting area. When a plurality of organic EL light-emitting elements are arranged in matrix form on the organic layer 26 to form a display apparatus, a second electrode 27 (see FIG. 1C) may be formed across the entire surface continuously.

In the conventional, coated-type organic EL light-emitting element having such a structure, when the organic EL light-emitting elements are arranged in matrix form in a display apparatus, a coating solution overflows an opening 23a surrounded by the insulation bank 23 and spreads to neighboring light-emitting area since a liquid droplet volume per one drop ejected by an ink-jet process is large, as described above. To avoid this problem, some improvements described below have been conducted.

For example, an attempt to increase a height h of an insulation bank 23 from a first electrode 22 (see FIG. 1A, hereinafter simply referred to as "a height of an insulation bank 23") has been made. In this attempt, an insulation bank 23 is formed so as to have a height h of 2 μm or more, resulting in an increment of a volume within an opening 23a, and thus, a rather large liquid drop can be kept in an opening 23a. However, when a height of an insulation bank 23 is increased, a height difference between a surface of an organic layer 26 and a top surface of the insulation bank 23 will become large. This leads a problem in that a second electrode 27 which is formed across an entire surface of an organic layer 26 and top surface of the insulation bank 23 is likely disconnected stepwisely. To prevent this stepwise disconnection problem, it is necessary to form a second electrode 27 to have a thickness of 1 μm or more. This causes problems in that a time required for forming a second electrode 27 will become longer, and that more material will be needed for forming a second electrode 27, which results in an increment in the cost, and in addition to these problems, light can be hardly transmitted through such an electrode. As a result, this causes a problem in that an organic EL light-emitting element of a top emission type, in which light is taken out from a top surface, i.e. from a surface including the second electrode 27, cannot be produced. Further, when the height of the insulation bank is increased, light emissions in oblique directions may be blocked, resulting in poor viewing angle characteristics. Further, in order to form an insulation bank with a high height, it is necessary to form an insulation bank in such a way to have a large width. This demands a wide pixel pitch, causing the problem in that a high definition pattern is hard to be obtained.

Further, as for other attempts for the conventional, coated-type organic EL light-emitting element, an attempt to prevent a coating solution from spreading over a neighboring light-emitting area has been made by forming an insulation bank 23 in a way to have a reversed tapered shape (the shape in which a spacing between sidewalls of the insulation bank 23 in a vertical cross sectional view is decreased from a surface of the first electrode 22 toward a top surface of the insulation bank 23, i.e. a reversed shape of a forward tapered shape). However, making such a reversed tapered shape is difficult, and further, it causes a problem in that a stepwise disconnection of a second electrode 27 which is formed across an entire surface of an organic layer 26 and top surface of the insulation bank 23, as described above, may occur more frequently. Therefore, a stepwise disconnection problem of the second electrode 27 will become even severe compared to in the above-described attempt to increase a height h of the insulation bank 23, and thus, it is necessary to form a second electrode 27 much thicker.

On the other hand, in an exemplary embodiment according to the present application, by using an organic material with a smaller degree of polymerization, which is neither a polymer compound nor a low molecule weight compound and has a molecular weight of 300 or more and 5000 or less, preferably about 3000 or less, more preferably 500 or more and 1000 or less, in other words, by using an organic material of an oligomer, preferably an oligomer from a dimer to a decamer, as an organic material to be dissolved in a coating solution, a small liquid drop of a coating solution having a volume per one drop of about 0.05 pL or more and about 1 pL or less was obtained. This enables to form an insulation bank 23 to have a smaller height h in an area with a small size since there is no possibility that a coating solution 25a overflows an opening 23a, even if the size of an area to which a coated layer will be formed is small (see, FIGS. 1A and 1B). A coating solution 25a will not overflow from a small area, such as an area with a size of 10 μm square or more and 50 μm square or less, surrounded by an insulation bank 23 with a height of about 1 μm or less. Therefore, in the presently illustrated embodiment of the present application, an insulation bank 23 may be formed with a height h of 0.5 μm or more and 1 μm or less. As an insulation bank 23 was able to be formed to have such a small height, a stabilized insulation bank 23 can be formed even when a width of an insulation bank member is not wide. Therefore, a width of an insulation bank between the neighboring pixels also can be formed to be narrow, thereby extremely high definition pixels with a minimum size of 10 μm square can be realized with a high definition pattern with a small pixel pitch such as 25 μm. Further, as a height of an insulation bank 23 is formed to be small, a problem of poor viewing angle characteristics which the conventional, coated-type organic EL light-emitting element has, in other words, the problem in that a light from a light-emitting layer is blocked when viewed from an oblique direction, or a problem in that a sufficient amount of light cannot be obtained when viewed from above was improved.

Further, according to the presently illustrated embodiment, there is no need to form an insulation bank 23 in a reversed tapered shape. An insulation bank 23 may be formed in a forward tapered shape. Namely, an insulation bank 23 may be formed to have a taper angle θ to the horizontal plane of a sidewall of the insulation bank 23 (see, FIG. 1A) of 10° or more to 80° or less, for example, preferably an insulation bank 23 may be formed in a forward tapered shape such as to have a taper angle θ of about 60° or less. As a result, a stepwise disconnection problem of the second electrode 27 can be further avoided. Consequently, the second electrode 27 can be formed with a thin thickness, for example, with a thickness of about 5 to 30 nm, preferably 10 nm or more and 25 nm or less without causing a stepwise disconnection problem. As a result, in the presently illustrated embodiment, a light-emitting element may be formed either as a top emission type light-emitting element or as a bottom emission type light-emitting element. Further, according to the presently illustrated embodiment, an insulation bank 23 can be formed in a forward tapered shape, and thus a barrier layer 28 can be also coated on the second electrode 27 without a risk of stepwise disconnection. In other words, a barrier layer 28, which has a good sealing performance enough to satisfactory prevent a penetration of water and/or oxygen into the organic layer 26, can be formed. Therefore, according to the presently illustrated embodiment, an organic EL light-emitting element having a high reliability, in which a deterioration due to a penetration of water and/or oxygen into the organic layer 26 will be hardly occurred, can be obtained.

Further, when an insulation bank 23 is formed to have a forward tapered shape with a taper angle θ to the horizontal plane of 60° or less, a force to keep a coating solution in an opening 23a may become weaker compared to an insulation bank 23 having a reversed tapered shape or an insulation bank 23 with a taper angle θ close to 90°. Consequently, coating can be performed so as to have a further uniform layer thickness, and also an area of an organic layer 26 having a uniform layer thickness may be extended.

Since a small-sized liquid drop was able to be formed as described above, the organic layer 26 was formed successfully and precisely even in a light-emitting area with a small size, such as a small-sized light-emitting area of about 10 μm×10 μm, which is much smaller compared to the conventional size of 70 μm×210 μm that is a limit size of the area that can be formed in the conventional, coated-type organic EL light-emitting element. As a result, even a light-emitting element to be used for a small, high definition display apparatus such as a smartphone can be formed with a coated-type organic layer. Further, it was found that a concentration of solute in the coating solution can be increased to about 10 mass % to 30 mass % by using an oligomer as an organic material and thus the organic layer can be formed efficiently even in the small light-emitting area.

As described above, the inventors found out that by applying a compound, which has a molecular weight of about 300 or more and 5000 or less, preferably about 3000 or less, more preferably about 500 or more and 1000 or less and a degree of polymerization similar to the degree the oligomers have, as an organic material for an coated-type organic layer 26, a small droplet which has a volume per one drop of about 0.05 pL or more and 1 pL or less and a nearly spherical shape can be formed and a coating solution can drip as a small droplet to even a small area having a size of about 100 μm² if a size of an ejecting port of a nozzle of an ink-jet apparatus is set to about 10 to 20 μm in diameter, and thus a coating solution never overflows an opening 23a surrounded by the insulation bank 23.

A coating solution containing an oligomer according to the presently illustrated embodiment is suitably applicable to an area having a similar size to the conventional, coated-type organic EL light-emitting element. However, it is particularly effective to a light-emitting area of 3500 μm² or less, preferably 2500 μm² or less, which has not been able to be formed from the conventional coated-type organic layer. Therefore, according to the presently illustrated embodiment, a coated-type organic layer can be obtained via an ink-jet process on even an area with a small size of, for example, 100 μm² or more and 2500 μm² or less, preferably 1200 μm² or less, more preferably 850 μm² or less, or, 520 μm² or more and 850 μm² or less, in other words, 17 μm×50 μm or less for a high definition panel of a medium or large size, or 25 μm×25 μm or less for a high definition panel of a small size, such as a hand-held display apparatus, or a small area where a length of one side is about 10 μm. Thus, an organic EL light-emitting element according to the presently illustrated embodiment can form a pixel of the organic EL display apparatus, which has a resolution around 500 ppi or a higher pixel density for an apparatus with a size of the smartphone. A cross-sectional area of an ejecting port of a nozzle may be increased when an organic layer is formed on a large area, and then, the organic layer can be formed on even a large area in a relatively short time. When the shape of an area to be coated is a rectangular shape, and if a length of one side of the rectangular shape is too small (a width of the rectangle is too narrow), it becomes impossible to apply a liquid drop to the area precisely. Therefore, when a shape of the area to which an organic layer 26 will be formed has a rectangular shape, it may be preferable that a short side of the rectangle is 10 μm or more. In other words, a squared value of this lower limit of a length of the short side will be a lower limit of a size of a pixel which can be formed by the presently illustrated embodiment. It should be appreciated that a shape of the area to which an organic layer 26 will be formed, i.e. a shape of a pixel, is not limited to a rectangular shape or a square shape, and may be a round shape, elliptic shape, or polygon.

In the presently illustrated embodiment, even when a coating solution 25a is coated to a small light-emitting area surrounded by an insulation bank 23, there is no risk for a coating solution 25a to overflow an insulation bank 23. Therefore, an organic layer was formed successfully by a coating process on an area of the light-emitting area formed with the above described high definition pattern without an occurrence of color mixing problem, even when any attempts, which had been conducted when the organic EL light-emitting elements were arranged in matrix form for a display apparatus using the conventional, coated-type organic EL light-emitting element, in order to prevent a coating solution from overflowing an opening 23a surrounded by the insulation bank 23 were not conducted, i.e. even when a material with a liquid repellent property was not used for an insulation bank or a liquid repellent treatment was not conducted to a surface of an insulation bank 23.

An organic layer 26 may include one or more organic layers such as a hole transport layer or an electron transport layer, other than a light-emitting layer. In case where the organic layer 26 is formed with a plurality of layers, a material for each layer should be an organic material containing an oligomer as mentioned above. Further, an organic layer 26 according to the presently illustrated embodiment may further include an optional layer between the organic layer 26 and a first electrode 22 or a second electrode 27, or between each of the organic layers when the organic layer 26 is formed by one or more organic layers. Further, a TFT (not indicated) or a planarization layer (not indicated) and so on may be formed on a substrate 21. It should be noted that an organic EL light-emitting element shown in FIGS. 1A to 1C according to the exemplary embodiment described below is a top emission type, however, as described above, it may be formed either for a bottom emission type or a both sides emission type.

An organic EL light-emitting element according to the presently illustrated embodiment may be applicable to an illumination apparatus by sealing one or more organic EL light-emitting elements with an envelope (a covering layer) which has at least a translucent front surface, or to a display apparatus by arranging a plurality of light-emitting elements in matrix form. When applied to an illumination apparatus, light-emitting elements of three colors, red (R), green (G) and blue (B) are enclosed in one envelope, providing a white light-emitting illumination apparatus. A white light or a light of any other desirable colors emitting illumination apparatus may be also formed by covering a monochromatic light-emitting element by a fluorescent resin.

When applied to a display apparatus, sub-pixels of three colors, R, G and B are formed respectively for each pixel (one pixel) arranged in matrix form, providing a full-color display apparatus. In this case, a size of each sub-pixel is about one-thirds of the size of one pixel, and its area is smaller than the area of one pixel. A material for an organic layer for each sub-pixel and a planar shape of a sub-pixel could be different each other, however, a layered structure formed with, for example, a first electrode 22, an organic layer 26, a second electrode 27 is same, and thus a sub-pixel is herein described as one light-emitting element (one pixel) without distinguishing a sub-pixel from a pixel. An arrangement of the pixels is not particularly limited, and the pixels may be arranged, for example, in a mosaic arrangement, a delta arrangement, a stripe arrangement, and a pentile arrangement. In each pixel, a first electrode 22 of an organic EL light-emitting element is connected to a driving element, and a predetermined color corresponding to each pixel is emitted by the on-off control of each pixel and various luminescent colors are realized by mixing different colors.

A substrate 21 may be a support substrate formed with, for example, a glass plate, a polyimide film. In case where the substrate 21 does not need to be translucent, a metal substrate or a ceramics substrate may be used as well. When applied to a display apparatus, though FIGS. 1A to 1C do not illustrate completely, a driving element such as TFT is formed on a position corresponding to an arrangement place for a pixel. A planarization layer, which is formed by a material such as acrylic resin or polyimide, may be formed on a driving element for planarization. A material for a planarization layer is not limited to those described above, and may be an inorganic material such as $SiO_2$, SOG, however, an organic material may be preferable to be applied in order to eliminate irregularities of the surface easily. A first electrode 22 is formed by a combination of a metal layer such as Ag or APC and an ITO film at a portion of a surface of the planarization layer which corresponds to an area to which an organic EL light-emitting element is formed. An organic layer 26 is coated on the first electrode 22.

An insulation bank 23, which is formed by, for example, a silicon oxide, a silicon nitride, a silicon oxynitride, an acrylic resin, a polyimide resin, and a novolak-type phenol resin, is formed around a first electrode 22 which constitutes each pixel, as described in FIGS. 1A to 1C, in order to divide pixels as well as to prevent a contact between the first electrode 22 and the second electrode 27. The insulation bank 23 is formed in such a way that it surrounds at least part of the first electrode 22. As shown in FIG. 1A, in the presently illustrated embodiment, the insulation bank 23 is formed in such a way that it covers a peripheral portion of the first electrode 22 which is formed in a predetermined area. However, an insulation bank 23 may be formed so as to contact with the first electrode 22 without covering the first electrode 22 or formed separately from the first electrode 22. In other words, an insulation bank 23 may be formed to surround a larger area than the area to which the first electrode 22 is formed. However, the area to which the light-emitting element is formed is very small, as described above, it may be preferable to form the insulation bank 23 so as to overlap with a peripheral portion of the first electrode 22.

In either case, it is important to form a layered structure in which the first electrode 22 and the second electrode 27, which is formed after a formation of the organic layer 26, are never in contact with one another (inducing a leakage). Therefore, as described above, it may be preferable that an organic layer 26 is provided in an area surrounded by an insulation bank 23 so as to cover an entire surface of the first electrode 22 which is exposed in an opening 23a surrounded by the insulation bank 23. A second electrode 27 may be formed on the organic layer 26. However, an organic layer 26 may be formed on the first electrode 22 to have a size smaller than the size of the first electrode 22 without covering an entire surface of the first electrode 22, and a second electrode 27 may be formed on the organic layer 26 to have a size further smaller than the size of the organic layer 26.

An area of the first electrode 22 surrounded by this insulation bank 23 may be formed such that a size of the area is to be a 17 μm×50 μm rectangular shape for a high definition panel of a medium or large size, or a 25 μm×25 μm square shape for a high definition panel of a small size for, for example, a hand-held display apparatus, referring to d1×d2 shown in FIG. 1B (d2 shows a size in the direction vertical to the paper surface and is not shown in the figure). Associated with recent trends of a miniaturization and a definition enhancement of electronic apparatus as described above, this size tends to become smaller and smaller, however, a precise coating of the small area can be conducted by using the above-described coating solution, even when a size of the small area, which is the area of the first electrode 22 surrounded by the insulation bank 23, is about 520 μm². For example, the coating solution according to the exemplary embodiment is suitable to coat an area with a size of about 520 μm² or more and about 850 μm² or less. The coating solution according to the exemplary embodiment may be coated even to an area of about 10 μm×10 μm. The above-mentioned length, as described as a length of one side of the pixel having a rectangular shape, is merely an example, and a size of an area to be coated may have any sizes that correspond to various pixel shapes for the desired display apparatus.

Among the coated-type organic layers 26, organic materials each correspond to a color from R, G, and B may be used for each of light-emitting layers. However, a light-emitting layer may be formed using the same material, and a color filter may be provided on the surface of the light-emitting layer to obtain a color R, G, or B through a color filter. Further, the organic layer 26 other than a light-emitting layer may include a hole transport layer or an electron transport layer, or a layered structure thereof. In case where a light-emitting property is considered the most important, it may be preferable to coat a material suitable for a light-emitting layer separately for forming such a hole transport layer or such an electron transport layer. However, when using a coating process, it is possible to form an organic EL light-emitting element with a coated-type organic layer 26 which includes a fewer number of layers by mixing organic materials each of which forms respective layers.

For example, in order to form the organic layer 26, as described, for example, in FIG. 1A, a coating solution 25a of an organic material containing an oligomer is dropped onto a first electrode 22 surrounded by an insulation bank 23 from a nozzle 31 of an ink-jet apparatus. An organic compound having a structure, in which two or more and 10 or less of monomers, preferably two or more and five or less of monomers, containing a structural unit which contributes to an light-emitting property of the material generally applicable to a light-emitting layer of the organic EL light-emitting element are polymerized, may be used as an oligomer. The material generally applicable to a light-emitting layer of the organic EL light-emitting element refers to, for example, materials used as the conventional, dye-based material or polymer material. Specifically, an oligomer according to the exemplary embodiment may be a compound obtained by a polymerization of 2 to 10 monomers, which include a structural unit represented by a general formula (I): —[Y]—, wherein Y includes a skeleton selected from, for example, a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton.

With a dropping of a coating solution 25a, a coated layer 25 is formed as described in FIG. 1B. The coated layer 25 spreads into an area surrounded by an insulation bank 23, which serves as a dam, and remains in the area. By drying this, a solvent component in the coating solution 25a is evaporated, providing a thickness being about one-thirtieth of the thickness of the coated layer 25, for example, about 10 to 20 nm per one layer (per one material). By conducting this coated-type organic layer 26 formation process repeatedly with necessary materials, a coated-type organic layer 26 is formed. In FIG. 1C, the coated-type organic layer 26 is descried in one layer, however, as described above, in general the coated-type organic layer 26 will be formed with a plurality of layers.

As described above, in the presently illustrated embodiment, the element is a top emission type in which a light is emitted from the surface of the element which is the opposite to the surface including a substrate 21 in FIGs, and thus a second electrode 27 formed on the organic layer 26 is formed of a translucent material such as a thin eutectic layer composed of magnesium and silver. Other materials such as aluminum can be also used. It should be noted that in case where the element is a bottom emission type in which a light is emitted through the substrate 21, a material such as ITO, $In_3O_4$ may be used for a first electrode 22 and a metal having a small work function such as Mg, K, Li, Al may be used for a second electrode 27. On the surface of the second electrode 27 a barrier layer (a covering layer) 28 (see FIG. 1C) may be formed. This covering layer 28 may be replaced with a seal layer (an envelope), which is described below. It may be preferable to form a barrier layer 28 with a plurality of layers that are formed by the material such as $Si_3N_4$, $SiO_2$, since such a barrier layer 28 could provide a fine layer quality. The whole part may be sealed by a seal layer (not indicated) formed by, for example, a glass or a resin film with a moisture-resistant property so as to be formed such that the organic layer does not absorb water.

As described above, since the organic material for an organic layer 26 according to the presently illustrated embodiment is an oligomer with a polymerization degree of 2 to 10, having a molecular weight of 300 to 5000, the organic material has a solubility to a solvent sufficient to be applied for a coating solution 25a for ink-jet process which is ejected from a nozzle of ink-jet apparatus to form a coated layer 25 by coating. A concentration of the oligomer in the coating solution 25a according to the presently illustrated embodiment may be adjusted to a concentration which enables to form an organic layer 26 with a desirable thickness, and it can be, for example, about 10 mass % to 30 mass %. Further, since the oligomer has the above described polymerization degree, only the oligomer having a desirable polymerization degree can be isolated and purified after the synthetic reaction by a purification method such as a separation by a chromatography including a column chromatography and gel permeation chromatography, a reprecipitation, a recrystallization. In the presently illustrated embodiment, the oligomer which is highly purified and has no molecular weight distribution can be used as an organic material for the organic layer 26, and thus, the color purity and brightness can be enhanced when such an organic material is applied to an organic EL light-emitting element compared to the element where an organic material containing a polymer compound which is not easily purified and difficult to be obtained as a highly purified compound is used. Also, to use an oligomer of the organic material as an organic material may prevent a crystallization or aggregation of the organic material when being coated, and thus, a stability of a layer of the organic layer 26 to be formed may be increased compared to the layer formed from the organic material containing a low molecule weight compound which is, for example, crystallized easily in general. If a crystallization or aggregation of the organic material occurs in the organic layer, a brightness of the area in which a crystallization or aggregation occurs and a layer thickness is relatively increased is relatively decreased because an amount of the current to be injected is reduced compared to the area in which such a crystallization or aggregation does not occur, possibly causing variation in the distribution of the light emission intensity within a pixel. Also, there would be a possibility that the lifetime of the element itself may be shortened because of a deterioration occurred in the area having a thin thickness due to a concentration of current in the area having a relatively thin thickness. The occurrence of this kind of problems can be prevented by using an oligomer of the organic material of the exemplary embodiment of the present application for an organic layer 26 of the light-emitting element. Therefore, an organic EL light-emitting element with a high definition having a long lifetime and superior light emission intensity can be provided by a method for manufacturing a coated-type element using a relatively inexpensive printing method.

In one embodiment of the present application, an organic layer 26 of the organic EL light-emitting element may include one or more organic materials which have a superior property such as a hole transport property or an electron transport property, in addition to the light-emitting organic material, as described above. For example, a coating solution 25a containing a composition formed by mixing an oligomer of an organic material which is a light-emitting material and a compound having a hole transport property or an electron transport property may be used for a formation of the organic layer 26. An oligomer of different kinds of organic materials, for example, an oligomer as a light-emitting material and an oligomer having a hole transport property, may be mixed and used to form an organic layer 26 through a coating process. It should be noted that a combination of the materials is not limited to those described above. This may enable to reduce a number of layers in the organic layer 26 of the organic EL light-emitting element. This may improve a flatness of the organic layer 26 and prevent an occurrence of a display unevenness such as a luminance unevenness or a light emission color unevenness when the organic layer 26 emits light.

Figure 2:
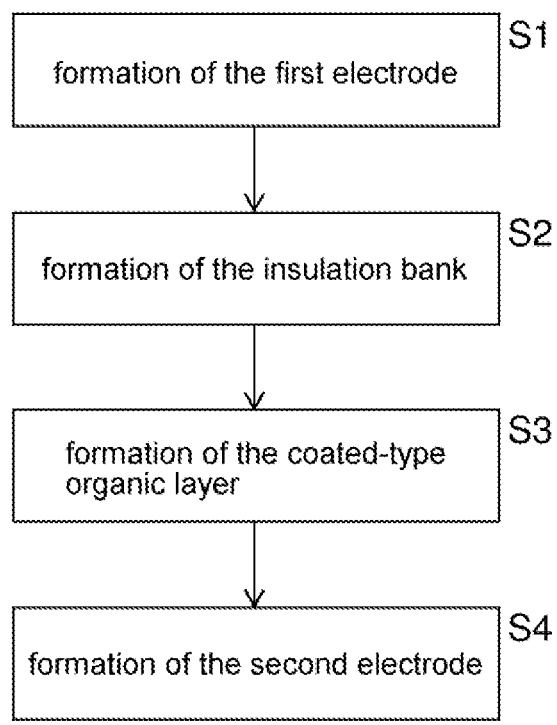
FIG. 2 shows a flowchart of a manufacturing process according to one embodiment of the present application.

Referring to a flowchart in FIG. 2, a method of manufacturing an organic EL light-emitting element according to the second embodiment of the present application include forming a first electrode 22 on a surface of a substrate 21 (S1), forming an insulation bank 23 to surround at least part of the first electrode 22 (S2), forming a coated-type organic layer 26 on an area of the first electrode 22 surrounded by the insulation bank 23 (S3), and forming a second electrode 27 on the organic layer 26 (S4). This organic layer 26 is formed by dropping a droplet of a liquid composition comprising the above described oligomer of an organic material using an ink-jet process. More detailed description will be followed below.

When applying the light-emitting element to an organic EL display apparatus, as described above, a driving TFT, for example, which forms a driving circuit on the substrate 21, is formed with an amorphous semiconductor, for example, by a usual method using a lithography process, for example. It is planarized by, for example, using a polyimide resin to planarize irregularities of the surface. The first electrode 22 is formed in matrix form according to an arrangement of each pixels on its surface. This first electrode 22 is also formed by forming the above described material for electrode on the entire surface and being subjected to a patterning process (S1).

Subsequently, the insulation bank 23 is formed (S2). This insulation bank 23 may be formed by an inorganic material such as a silicon oxide, a silicon nitride, a silicon oxynitride, or, if a thicker layer is required, it may be formed in a short time by using a material such as an acrylic resin, a polyimide resin or a novolak-type phenol resin. For example, an insulation bank 23, which includes an opening 23a that exposes at least part of the first electrode inside thereof as illustrated in FIG. 1A, is formed by (i) forming an insulation layer on the entire surface with a thickness of, for example, about 0.5 μm to 1 μm, which should provide a sufficient height for an insulation bank 23, and (ii) being subjected to a pattering process using a photolithography technique. In this case, an insulation bank 23 may be formed to have a forward tapered shape as described above. An area of the first electrode 22 that is exposed in an opening 23a after the formation of the insulation bank 23, which is, the area of the first electrode 22 to which an organic layer 26 is provided, is, for example, 100 μm$^2$ or more and 2500 μm$^2$ or less. By using a photosensitive resin material among the above-described resin materials, this kind of fine patterning can be precisely formed using a photolithography technique.

A surface modifying treatment such as ashing or plasma treatment may be conducted to a surface of the first electrode 22 exposed in the opening 23a after the formation of the insulation bank 23. This makes it possible, for example, to provide a hydrophilic property to a surface of the first electrode 22, to remove (be cleaning) an organic substance adhered to a surface of the first electrode 22, or to adjust a work function near the surface of the first electrode 22. Further, this can make an adhesion between an organic layer 26 to be formed on a first electrode 22 and a first electrode 22 stronger.

The insulation bank 23 may be formed by a hydrophilic material, or, the surface of the insulation bank 23 may be formed to have a hydrophilic property by conducting a surface modifying treatment, such as UV irradiation treatment, ozone treatment, plasma surface treatment, to the surface of the insulation bank 23 exposed inside the opening 23a. As a result, a wettability of a coating solution to the insulation bank 23 may be improved and thus a coating solution being dropped inside an opening 23a may spread up to a peripheral portion of a first electrode 22 and the organic layer 26 may evenly fill a space from a bottom of an opening 23a to a sidewall of an opening 23a, forming an organic layer 26 with an excellent flatness.

Subsequently, a coating solution 25a of the above mentioned organic material is ejected from a nozzle 31 by an ink-jet process, as illustrated in FIG. 1A. The ejection of the coating solution 25a is conducted by aligning the nozzle 31 to the first electrode 22 exposed in the opening 23a surrounded by the insulation bank 23. As illustrated in FIG. 1B, an ejected coating solution 25a forms a coated layer 25 in the opening 23a surrounded by the insulation bank 23 (S3).

In particular, as illustrated in FIG. 1A, a coating solution 25a of an organic material containing the oligomer according to the embodiment of the present application is ejected from a nozzle 31 of the ink-jet apparatus and drips on an area of the first electrode 22 surrounded by the insulation bank 23 in a volume per one drop of about 0.05 pL or more and about 1 pL or less. A coating solution 25a may be a liquid composition containing at least an oligomer according to the embodiment of the present application and a solvent. Any solvents capable of dissolving an organic material containing an oligomer according to the embodiment of the present application may be used, and preferably an organic solvent may be used. Examples of the organic solvent is not particularly limited, however, when a low-boiling point solvent is used as a solvent, this would cause a clogging in the nozzle of ink-jet apparatus, or, a thickness unevenness would be occurred since drying of a coating solution 25a may begin right after being ejected from a nozzle 31 and a solute may be precipitated. Therefore, a low-boiling point solvent may be preferably used in combination with a solvent having a higher boiling point. For example, as the solvent, a chlorine based solvent, ether based solvent, aromatic hydrocarbon based solvent, aliphatic hydrocarbon based solvent, ketone based solvent, ester based solvent, alcohol based solvent, amide based solvent, and a mixed solvent thereof are exemplified. Among them, a mixed solvent containing cyclohexylbenzene, xylene or anisole, or one or more of those may be preferable in terms of, for example, an evenness of a formed layer and viscosity property of a coating solution 25a, but a solvent is not limited to those. A coating solution 25a may be prepared to have a viscosity at 25° C. of about $0.6 \times 10^{-3}$ Pa·s or more and about $3 \times 10^{-3}$ Pa·s or less, preferably about $1 \times 10^{-3}$ Pa·s or less. With a viscosity of this range, a coating solution 25a can be ejected from an ink-jet head as a droplet having a substantially constant particle diameter, and a steady ejection from the ink-jet apparatus can be realized even when using an apparatus provided with multiple nozzles.

Subsequently, a eutectic layer composed of magnesium and silver, for example, is formed by, for example, a vapor-deposition on the entire surface to form a second electrode 27 on the organic layer 26 (S4). In the organic EL light-emitting element according to the presently illustrated embodiment, the second electrode 27 serves as a cathode. An example of the material which constitutes a second electrode 27 is as described above, and the second electrode 27 is formed of a thin metal layer to have a thickness of about 5 nm or more and 30 nm or less, preferably a thickness of 10 nm or more and 25 nm or less. In the presently illustrated embodiment, as the insulation bank 23 is formed so as to have a height of about 0.5 µm or more and 1 µm or less from a surface of the first electrode 22, even when a second electrode 27 is formed by such a thin layer thickness, the second electrode 27 can be formed with a uniform layer thickness on an entire surface of an organic layer 26 and top surface of the insulation bank 23 without causing a problem such as a stepwise disconnection. In the presently illustrated embodiment, the second electrode 27 is formed on the entire surface including the top surface of the insulation bank 23, since it is formed as a common electrode for each pixel.

Next, a barrier layer 28 which serves as a seal layer to prevent a penetration of water and/or oxygen from the outside is formed on the second electrode 27. This barrier layer 28 may be an inorganic layer formed of, for example, $Si_3N_4$ or $SiO_2$, which has no hygroscopic property and may be formed by bonding to a substrate 21 (not indicated) in such a way to entirely cover the second electrode 27 and organic layer 26 and so on. Consequently, the organic EL light-emitting element of the embodiment of the present application is completed (see FIG. 1C). This method is described herein as merely an exemplary example, and a method of manufacturing an organic EL light-emitting element of the embodiment of this application may further include optional steps between each step. For example, when a coating solution 25a is dropped multiple times on different positions in an area surrounded by the insulation bank 23 as described above, a planarization process may be conducted to planarize a coating solution 25a dripped in the area before the drying process of the coated layer 25.

As described above, by using an organic material containing an oligomer of the organic material as an organic material for the organic layer 26 of the organic EL light-emitting element, a coated-type organic layer 26 can be provided excellently on a small area with a size of 100 µm² or more and 2500 µm² or less on the electrode. As a result, a display unevenness such as a thickness unevenness can be reduced, and an organic EL light-emitting element with a high definition pattern having a superior light-emission property can be obtained at a low cost. Also, by using an organic material containing an oligomer of the organic material as an organic material for the organic layer 26 of the organic EL light-emitting element, an insulation bank can be formed to have a small height h, and thus a second electrode 27 with a thickness of about 5 to 30 nm may be formed continuously on an entire surface of an organic layer 26 and top surface of the insulation bank 23.

SUMMARY (1) An organic electroluminescent light-emitting element according to the first embodiment of the present application includes a substrate, a first electrode provided on a surface of the substrate, an insulation bank formed to surround at least part of the first electrode, an organic layer formed on the first electrode surrounded by the insulation bank, and a second electrode formed on the organic layer, wherein the insulation bank has a forward tapered shape, an area of the first electrode surrounded by the insulation bank is 100 µm² or more and 2500 µm² or less, and the organic layer is a coated-type organic layer comprising an oligomer of an organic material.

According to the organic EL light-emitting element of the exemplary embodiment of the present application, a volume per one drop of a liquid drop of a liquid composition to be ejected form a nozzle of the ink-jet apparatus to form a coated layer can be small since the organic material to form a coated-type organic layer contains an oligomer, and thus, there is no possibility that a liquid composition overflows the insulation bank and spreads to the electrodes of neighboring pixels. This enables a separate coating of an area of the first electrode surrounded by the insulation bank, even if the area is a small area with a size of 100 µm² or more and 2500 µm² or less. A high definition pattern formation of pixels can be realized by coating process.

(2) It may be preferable that a height of the insulation bank from a surface of the first electrode is from 0.5 µm or more and 1 µm or less. This enables a formation of an insulation bank member with a narrow width, allowing a small pixel pitch. As a result, high definition pixels can be realized with a high definition pattern with a small pixel pitch of, for example, 25 µm. Further, poor viewing angle characteristics can be improved since there arises no problem that a light emission in an oblique direction is blocked by an insulation bank with a large height.

(3) It may be preferable that a surface of the insulation bank is formed to have a hydrophilic property. A dripped coating solution ejected to form a coated layer may be easily spread onto a surface of the insulation bank, enabling to form the organic layer which evenly fills up to a sidewall of an opening surrounded by the insulation bank. As a result, the organic layer with an excellent flatness can be formed on the first electrode.

(4) It may be preferable that a thickness of the second electrode is 10 nm or more and 25 nm or less. Forming a second electrode to have a thickness of this range makes it possible to produce an organic EL light-emitting element as a top emission type.

(5) Further, a method of manufacturing an organic EL light-emitting element of the second embodiment of the present application includes forming a first electrode on a surface of a substrate, forming an insulation bank to surround at least part of the first electrode, forming a coated-type organic layer on an area of the first electrode surrounded by the insulation bank, and forming a second electrode on the organic layer, wherein the insulation bank is formed so that the area of the first electrode surrounded by the insulation bank is 100 µm² or more and 2500 µm² or less and so as to have a height of 0.5 µm or more and 1 µm or less from a surface of the first electrode, and a step for forming the organic layer is conducted by applying a droplet of a liquid composition comprising an oligomer of an organic material using an ink-jet process.

According to the method of manufacturing an organic EL light-emitting element of the second embodiment of the present application, even when a pixel is a small area of 100 $\mu m^2$ or more and 2500 $\mu m^2$ or less which is surrounded by the insulation bank having a height of 0.5 $\mu m$ or more and 1 $\mu m$ or less, an organic EL light-emitting element can be obtained in which an organic layer is formed with a high definition pattern on a pixel electrode by a coating process. Therefore, a small-sized, high definition organic EL light-emitting element can be manufactured easily and inexpensively.

(6) It may be preferable that a volume per one drop of the droplet of the liquid composition dropped using the ink-jet process in the step for forming the organic layer is 0.05 pL or more and about 1 pL or less, since this enables a precise formation of a coated layer for an organic layer even on a pixel in a fine pattern.

DESCRIPTION OF REFERENCE NUMERALS 21 substrate
22 first electrode
23 insulation bank
23a opening
25 coated layer
25a coating solution
26 organic layer
27 second electrode
28 barrier layer
31 nozzle

The invention claimed is:

1. An organic electroluminescent light-emitting element comprising:
    a substrate,
    a first electrode provided on a surface of the substrate,
    an insulation bank formed to surround at least part of the first electrode,
    an organic layer formed on an area of the first electrode surrounded by the insulation bank, and
    a second electrode formed on the organic layer,
    wherein the insulation bank has a forward tapered shape,
    an area of the first electrode surrounded by the insulation bank is 100 $\mu m^2$ or more and 850 $\mu m^2$ or less,
    the organic layer is a coated-type organic layer comprising a light-emitting layer formed solely of an oligomer of an organic material, and
    the oligomer of the organic material is a compound obtained by a polymerization of a monomer, the monomer comprising a structural unit represented by a general formula of —[Y]—, wherein Y comprises a skeleton selected from a group consisting of a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton.

2. The organic electroluminescent light-emitting element of claim 1, wherein a height of the insulation bank from a surface of the first electrode is 0.5 $\mu m$ or more and 1 $\mu m$ or less.

3. The organic electroluminescent light-emitting element of claim 1, wherein a surface of the insulation bank is formed to have a hydrophilic property.

4. The organic electroluminescent light-emitting element of claim 1, wherein a thickness of the second electrode is 10 nm or more and 25 nm or less.

5. A method of manufacturing an organic electroluminescent light-emitting element comprising:
    forming a first electrode on a surface of a substrate,
    forming an insulation bank to surround at least part of the first electrode,
    forming a coated-type organic layer comprising a light-emitting layer formed solely of an oligomer of an organic material on an area of the first electrode surrounded by the insulation bank, and
    forming a second electrode on the organic layer,
    wherein the insulation bank is formed so that the area of the first electrode surrounded by the insulation bank is 100 $\mu m^2$ or more and 850 $\mu m^2$ or less and so as to have a height of 0.5 $\mu m$ or more and 1 $\mu m$ or less from a surface of the first electrode,
    the oligomer of the organic material is a compound obtained by a polymerization of a monomer, the monomer comprising a structural unit represented by a general formula of —[Y]—, wherein Y comprises a skeleton selected from a group consisting of a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton, and
    the light-emitting layer is formed by applying a droplet of a liquid composition comprising the oligomer of the organic material using an ink-jet process.

6. The method of manufacturing an organic electroluminescent light-emitting element of claim 5, wherein a volume per one drop of the droplet of the liquid composition dropped using the ink-jet process in the step for forming the organic layer is 0.05 pL or more and 1 pL or less.

* * * * *